UNCOMPENSATED SOLAR CELL

Filed April 20, 1964

INVENTORS.
KRISHAN S. TARNEJA
MOHAMMED S. SHAIKH
MICHAEL F. AMSTERDAM
BY C. L. Menzemer
ATTORNEY.

United States Patent Office 3,421,946

Patented Jan. 14, 1969

3,421,946

UNCOMPENSATED SOLAR CELL

Mohammed S. Shaikh, Mountain View, Calif., Krishan S. Tarneja, Pittsburgh, and Michael F. Amsterdam, Greensburg, Pa., assignors to Westinghouse Electric Corporation, East Pittsburgh, Pa., a corporation of Pennsylvania Filed Apr. 20, 1964, Ser. No. 361,132

U.S. Cl. 136—89 3 Claims

Int. Cl. H01l 1/00

This invention relates to solar cells and in particular to cells adapted to convert solar and other radiant energy to electrical energy.

It is known that for good efficiency in solar cell applications, the device structure should be characterized by a low resistance on either side of the p-n junction therein and the carrier lifetimes on either side of the junction should be maximized.

With present practices in the preparation of solar cells, the attainment of the stated characteristics has not always been possible. For example, to secure a low resistance, high doping levels have been used in forming diffused junctions therein the device. High doping levels, however, have a detrimental effect on carrier lifetime.

In describing the prior art and setting forth the teachings of this invention the following terms are defined as follows:

Solar cell—a body of semiconductor material having a p-n or n-p junction therein and employed to convert solar or other radiant energy into electrical energy.

P-N cell—a solar cell wherein the p-type region is a relatively thin surface layer of p-type semiconductive material on a relatively thicker n-type semiconductive substrate.

N-P cell—a solar cell wherein the n-type region is a relatively thin surface layer of n-type semiconductive material on a relatively thicker p-type semiconductive substrate.

Intrinsic material is a body, region, layer or other definable quantity of semiconductor material which is neither p- or n-type as a result of doping with an impurity material.

Compensated material is a body, region, layer or other definable quantity of semiconductive material which was converted from a first-type of semiconductivity (either p or n) to a second-type of semiconductivity (either n or p) by overpowering the first-type inducing doping material by a second-type inducing doping material.

Uncompensated material is a body, region, layer or other definable quantity of a semiconductor which was converted from intrinsic material to either p or n type semiconductivity by the introduction of a doping impurity.

Conventional solar cells usually consist of a relatively thin body of semiconductor material in which a p-n or n-p junction is formed parallel to and near the surface of light incidence. Light absorbed in the body of semiconductor material ionizes electron hole pores which diffuse at random until the minority charge carriers, electrons in p-type material, holes in n-type material, either recombine or reach the junction and contribute to the output current.

In the prior art method of producing solar cells, a doping impurity capable of inducing a second-type of semiconductivity is diffused into a low resistivity opposite (first-type) conductivity type semiconductive material. The diffused layer must, therefore, be very highly doped to characterize the resulting layer with the appropriate conductivity and the necessary low resistivity. This results in a highly compensated diffused layer, and consequently the lifetime in the diffused region is very low compared with the lifetime of the bulk.

It is an object of the present invention to provide solar cells in which the relatively thin surface layer consists of uncompensated material.

Other objects will be apparent from time to time in the following detailed discussion and description.

The invention will be most readily understood upon considering its description in conjunction with the attached drawings in which.

Figure 1:
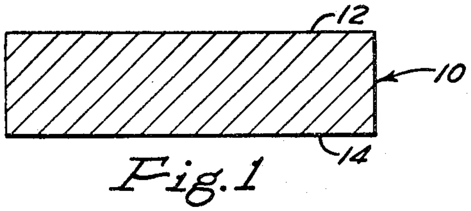
FIGURE 1 is a side view of a body of semiconductive silicon used in practicing the present invention.
Figure 2:
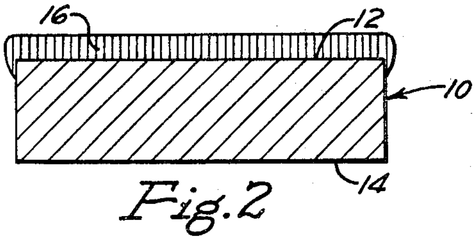
FIG. 2 is a side view of the body of silicon of FIG. 1 after epitaxial growth has been carried out.
Figure 3:
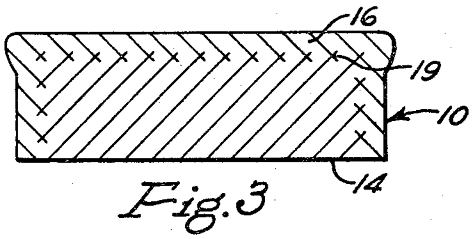
FIG. 3 is a side view of the body of semiconductive silicon showing the diffused zone produced therein.

In accordance with the present invention and attainment of the foregoing objects there is provided a solar cell comprising (1) a body of semiconductor material, said body having a first-type of semiconductivity, said body having oppositely opposed major surfaces, (2) an epitaxial layer disposed on one of said oppositely opposed major surfaces of said body, said epitaxial layer being thin relative to the thickness of said body, said epitaxial layer having a second-type of semiconductivity, said epitaxial layer being uncompensated, (3) a large area electrical contact, said large area electrical contact being disposed on the other said oppositely opposed major surface of said body, said large area electrical contact forming an ohmic electrical contact with said body of first type semiconductivity, (4) another electrical contact, said another electrical contact being disposed on a surface of said eptiaxial layer, said another electrical contact forming an ohmic contact with said epitaxial layer, said another electrical contact being of a smaller area than said large area electrical contact.

For ease of description and understanding, the invention will be described specifically in terms relating to the preparation of solar cells in which the semiconductor material is silicon. However, it should be understood that other semiconductive materials such as for example germanium, silicon carbide, Group III–V and Group II–VI compounds, can be used. It should also be understood that the silicon or other semiconductor employed can be processed so that the semiconductivity of the various regions may be reversed from that specifically shown and described.

Referring now to the drawing, there is shown a slice 10 of single crystalline silicon that may, for purposes of illustration, be considered of n-type semiconductivity. Of course, p-type semiconductivity material could be used as well. In addition the semiconductive material may be the web portion of a webbed dendrite produced in accordance with the teachings of the U.S. patent application of Dermatis and Faust, Jr., Ser. No. 98,618 filed Mar. 27, 1961, now Patent No. 3,129,061, and assigned to the assignee of the present application. Other ways of producing suitable semiconductive material are disclosed in the patent and technical literature to which reference may be made. Preferably the silicon slice 10 has a resistivity of from about 1 to 20 ohm-cm. when the starting material is n-type and from about 4 to 10 ohm-cm. when the starting material is p-type. Preferably the slice 10 will have a thickness of from about 4 to 15 mils but may in some cases be slightly thinner or thicker. The opposed major surfaces 12 and 14 can have dimensions of about 1 x 2 cm. though larger or smaller sizes can also be used. Larger sizes such as are readily obtained with webbed dendrites are preferred because they are more readily assembled into panels.

In accordance with the invention, an intrinsic epitaxial layer 16 of silicon is first provided over the entire upper surface 12 of the slice 10 of semiconductive silicon. The epitaxial layer should have a resistivity of from about 100 to 1000 ohm-cm., and a thickness of from about 0.5 to 10 microns. The specific details of providing epitaxial layers of semiconductive material are known and form no part of the present invention. While many methods are available, such layers can easily be provided in controlled thickness by hydrogen reduction of silicon tetrachloride. For this purpose, the wafer or slice 10 is disposed in a reaction zone such as a water-cooled quartz reaction vessel. A means is provided for saturating a stream of hydrogen with silicon tetrachloride. The furnace is provided with a heater, such as a radio frequency generator, whereby the wafer can be heated to a suitable temperature, i.e., about 1150° to 1280° C. for silicon. The silicon slice 10 is placed on a silicon or graphite heating pedestal within the quartz reaction vessel. Dry hydrogen may first be passed through the vessel so that surface oxide is removed from the crystal. Such treatment can be carried out, for example, at about 1295° C. for one-half hour or more. Thereafter, the temperature of the silicon crystal is lowered to the desired tetrachloride decomposition temperature, for example, about 1250° C.

The silicon tetrachloride saturator is heated to a temperature sufficient to provide it in a concentration of about one to three mol percent in the hydrogen stream. With the saturator heated, hydrogen is passed into the vessel at a flow rate of about one liter per minute. At these conditions, there results a layer 16 of epitaxial silicon of about one micron thick in about 30 minutes over the entire exposed upper surface 12 of the silicon slice 10. Suitably a layer of about 0.5 to 10 microns is produced.

The resulting slice 10 of silicon having the intrinsic epitaxial layer 16 thereon is then treated to diffuse into at least that film an opposite conductivity type material. Since the starting material was of n-type semiconductivity, the material diffused into the epitaxial layer will be p-type, for example, boron, aluminum, gallium or indium, with boron being particularly satisfactory. For n-type conductivity, phosphorus and arsenic are preferred though the other impurities could as well be used. Diffusion can be accomplished by placing the slice 10, after suitable cleaning, etching and like procedures have been applied, in a furnace in which there is an atmosphere of p-type conductivity material. The furnace used must withstand the temperature and pressure conditions attained during diffusion, and should not introduce undesired impurities. A clean quartz tube has been found to be satisfactory. Conditions suitable for diffusion of the p-type material are maintained for a period sufficient to form a p+ region throughout the epitaxial layer 16 having a resistivity of about 100 to 1000 ohm-cm. This may advantageously be accomplished by using two temperature zones within the furnace. Where the silicon is maintained, the temperature may range from about 600° to 1250° C. In the lower temperature zone, which is normally about 250° to 750° C., there is maintained a crucible or boat containing the material that supplies the p-type conductivity material. The acceptor can also be provided in gaseous form and in that instance is entrained in a gas supply used to control the atmosphere in the furnace during diffusion. In this latter practice, a single temperature zone within the furnace is satisfactory. Boron trichloride is a good doping material and is normally supplied by being entrained as just indicated. However accomplished, there results a diffused layer along the surfaces of the slice 10 and throughout the epitaxial silicon layer 16. Since the bulk semiconductive material is n-type, there also results a p-n junction at the interface of the epitaxial layer 16 and the bulk of the semiconductive slice.

After lapping off any diffused layer on the bottom surface there is applied to that surface 14 of the slice 10 of semiconductive silicon a large area metal contact 22. The area of contact 22 should be substantially equal to the area of surface 14 and coextensive with surface 14. The contact 22 can be n-type gold foil or other n-type contact metal, and is alloyed or otherwise applied to the bottom surface 14 in a manner such that good ohmic contact results. Alloying, by way of example, is readily accomplished by heating, to about 300° to 800° C. for a few minutes, the foil in contact with the silicon slice in an evacuated furnace. Since the alloying penetrates a portion of the bulk, it provides good ohmic contact with the n-region of the bulk.

Figure 4:
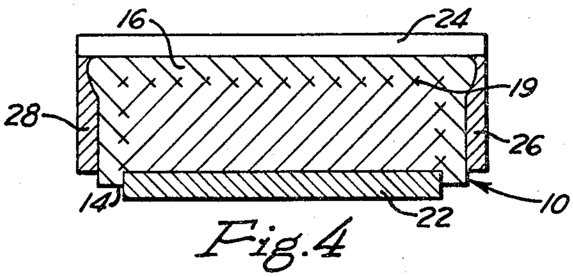
FIG. 4 is a side view of the semiconductive material after the application of contacts.
Figure 5:
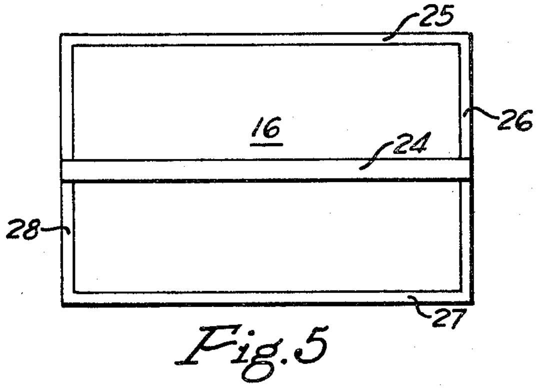
FIG. 5 is a top view of the device of FIG. 4.

After cleaning the surfaces, the structure is now ready for the application of contacts to the p-type epitaxial layer 16. Cleaning is satisfactorily accomplished by immersion sequentially in hydrofluoric and nitric acids followed by rinsing and drying. The grid contacts and a bus bar are applied in the conventional manner, for example by plating, by photo resist techniques, by alloying or the like. If desired, the bus bar can be omitted and instead metal contacts are applied not only as a grid, shown as grid 24 in FIG. 4, but also around the edges of the slice 10. In this latter practice, it is necessary that there be a diffused layer on which the metal is deposited to avoid shorting. Thus, by way of example, a photo resist coating can be applied to the top surface 12, and a film exposed thereon having the desired grid arrangement which is then developed. A metal, such as aluminum, can then be evaporated thereto in the conventional manner and simultaneously will coat all the side edges to provide metalized edges 26, 26, 27 and 28. These metalized edges contact the end portions of the grid member 24 and thus function in the same manner that bus bars have heretofore. Of course a plurality of grid members could be used if desired. The photo resist coating remaining can then be removed without disturbing the grid or side contacts.

The contact 24 should cover a minimum of 5% of the area of surface of the epitaxial layer 16 to insure adequate contacting but should not exceed 10% of the area so that a very major portion (90% to 95%) of the surface can be exposed to radiation.

The invention will be described further in conjunction with the following specific example in which the details are given by way of illustration and not by way of limitation.

A slice of n-type Czochralski grown single crystalline silicon having a resistivity of about 10 ohm-cm. is used. The slice is about 10 mils thick and has dimensions of about 1x2 cm. on its opposed major surfaces. The slice is first micropolished with an abrasive, and is then etched by dipping in an etchant comprising a mixture, by volume, of 5 parts of nitric acid, 3 parts of acetic acid and 3 parts of hydrofluoric acid. The cleaned slice is placed on a graphite support and inserted in a water cooled induction heated furnace. A mixture of hydrogen and silicon tetrachloride, in a ratio of 60 mols of hydrogen per mol of the tetrachloride, is passed into contact with the silicon slice while the latter is heated to a temperature of 1250° C. At these conditions a layer of intrinsic silicon is developed at a rate of about one micron per thiry minutes, after which the slice is withdrawn. A layer of two microns is grown.

The slice is then placed in a graphite boat in an induction heated furnace containing an atmosphere of nitrogen. While the temperature is being raised to 850° C., the nitrogen flows through the furnace. Then boron trichloride is admitted to the nitrogen stream in a volume concentration of about 2½ volume percent for about 8 minutes. Then the $BCl_3$ flow is stopped, and the furnace temperature is raised to 1150° C. for about 30 minutes. At these conditions the nitrogen does not react and therefore does not interfere with the desired doping. There results a boron concentration in the epitaxial silicon to provide a resistivity of 100 ohm-cm. and a p-n junction at the interface of the epitaxial layer and the n-type bulk. The bottom surface and the sides are machine lapped to expose the n-type bulk; the slice is again cleaned.

A gold foil containing about one weight per cent of antimony is then alloyed to the bottom surface by heating the assembly at about 750° C. for 10 minutes in an evacuated furnace. The foil is equal in area to the bottom surface and coextensive with the bottom surface.

The p-type epitaxial layer is then painted with a photo resist coating, a film is applied and developed with the grid and bus bar image thereon. Aluminum or other suitable contact metal is evaporated to the surface by heating a container of aluminum at about 750° C. in an evacuated furnace containing the slice of silicon for a short time, for example 2 to 3 minutes. The aluminum will coat all surfaces. Excess aluminum is removed by use of solvents such as alcohol or trichloroethylene. The alumnium will cover 10% of the surface area.

After cleaning, the device is provided with leads as by soldering, from the bus bar and the large area ohmic contact, to a load and used in the manner conventional for solar cell application.

From the foregoing discussion and description it is evident that the present invention comprises a uniquely simple procedure for preparing diffused type solar cells while avoiding lifetime loss in the diffused layer. While the invention has been described with respect to specific materials and procedures, it will be evident that substitutions and changes can be made. For example, the bulk material can usefully be a low resistivity webbed dendritic material, which can be provided with an intrinsic epitaxial layer in the same manner as just described followed by diffusion and the application of contacts. In addition to being free from compensation in the diffused layer, a cell prepared from a webbed dendrite is further advantageous in view of the substantial size cells that result. Other changes, substitutions and the like can be made without departing from the scope of the invention.

What is claimed is:

1. A solar cell comprising (1) a body of semiconductor material, said body having a first-type of semiconductivity, said body having a resistivity of from about 4 to 10 ohm-cm. when said first type of semi-conductivity is p-type and from about 1 to 20 ohm-cm. when said first-type of semiconductivity is n-type, said body having oppositely opposed major surfaces, (2) an epitaxial layer disposed on one of said oppositely opposed major surfaces of said body, said epitaxial layer being thin relative to the thickness of said body, said epitaxial layer having a second-type of semiconductivity, said epitaxial layer having a resistivity of from about 100 to 1000 ohm-cm., said epitaxial layer being uncompensated, (3) a large area electrical contact, said large area electrical contact being disposed on the other said oppositely opposed major surface of said body and substantially completely covering said surface, said large area electrical contact forming an ohmic electrical contact with said body of first type semiconductivity, (4) another electrical contact, said another electrical contact being disposed on a surface of said epitaxial layer, said another electrical contact forming an ohmic contact with said epitaxial layer, said another electrical contact being of a substantially smaller area than the surface upon which it is disposed.

2. A solar cell comprising (1) a body of semiconductor material, said body having a first-type of semiconductivity, said body having a resistivity of from about 4 to 10 ohm-cm. when said first-type of semiconductivity is p-type and from about 1 to 20 ohm-cm. when said first-type of semiconductivity is n-type, said body having oppositely opposed major surfaces, (2) an epitaxial layer disposed on one of said oppositely opposed major surfaces of said body, said epitaxial layer being thin relative to the thickness of said body, said epitaxial layer having a resistivity of from about 100 to 1000 ohm-cm., said epitaxial layer having a second-type of semiconductivity, said epitaxial layer being uncompensated, (3) a large area electrical contact, said large area electrical contact being disposed on the other said oppositely opposed major surface of said body, said large area electrical contact forming an ohmic electrical contact with said body of first type semiconductivity, (4) another electrical contact, said another electrical contact being disposed on a surface of said epitaxial layer, said another electrical contact forming an ohmic contact with said epitaxial layer, said another electrical contact being of a smaller area than said large area electrical contact.

3. A solar cell comprising (1) a body of semiconductor material, said body having a first-type of semiconductivity, said body having a thickness of from about 4 to 15 mils, said body having a resistivity of from about 4 to 10 ohm-cm. when said first-type of semiconductivity is p-type and from about 1 to 20 ohm-cm. when said first-type of semiconductivity is n-type, said body having oppositely opposed major surfaces, (2) an epitaxial layer disposed on one of said oppositely opposed major surfaces of said body, said epitaxial layer having a thickness of from about 0.5 to 10 microns, said epitaxial layer having a second-type of semiconductivity, said epitaxial layer having a resistivity of from about 100 to 1000 ohm-cm., said epitaxial layer being uncompensated, (3) a large area electrical contact, said large area electrical contact being disposed on the other said oppositely opposed major surface of said body and substantially completely covering said surface, said large area electrical contact forming an ohmic electrical contact with said body of first type semiconductivity, (4) another electrical contact, said another electrical contact being disposed on a surface of said epitaxial layer, said another electrical contact forming an ohmic contact with said epitaxial layer, said another electrical contact being of a smaller area than said large area electrical contact, said another electrical contact being disposed over and covering from 5% to 10% of the area of the surface upon which it is disposed.

References Cited

UNITED STATES PATENTS

| | | | |
|---|---|---|---|
| 2,644,852 | 7/1953 | Dunlap | 136—89 |
| 2,692,839 | 10/1954 | Christensen et al. | |
| 2,780,765 | 2/1957 | Chapin et al. | 136—89 X |
| 2,898,248 | 8/1959 | Silvey et al. | |
| 3,053,926 | 9/1962 | Ben-Sira et al. | 136—89 |
| 3,072,507 | 1/1963 | Anderson et al. | 148—33 |
| 3,081,370 | 3/1963 | Miller | 136—89 |
| 3,082,283 | 3/1963 | Anderson | 136—89 |
| 3,094,439 | 6/1963 | Mann et al. | 136—89 |
| 3,129,061 | 4/1964 | Dermatis et al. | 23—301 X |

OTHER REFERENCES

Irvin, J. C.: Bell Sys. Tech. J. vol. XLI, No. 2, March 1962. Pp. 387–394.

Kesperis, J. S.: 16th Ann. Power Sources Conf., Proc. October 1962. Pp. i and 73–77.

Mandelkorn et al.: 15th Ann. Power Sources Conf., Proc. October 1961. Pp. i and 102–105.

Herchakowski, A. et al.: 15th Ann. Power Sources Conf., Proc. October 1961. Pp. i and 120–124.

Mark, A.: J Electrochemical Soc. vol. 107, No. 6. June 1960. Pp. 568 and 569.

Miller, B.: Aviation Week July 31, 1961. Pp. 62–69.

ALLEN B. CURTIS, *Primary Examiner.*

U.S. Cl. X.R.

148—33